(12) United States Patent
Ryou et al.

(10) Patent No.: US 11,558,025 B2
(45) Date of Patent: Jan. 17, 2023

(54) BULK-ACOUSTIC WAVE RESONATOR

(71) Applicant: Samsung Electro-Mechanics Co., Ltd., Suwon-si (KR)

(72) Inventors: Jeong Hoon Ryou, Suwon-si (KR); Sang Uk Son, Suwon-si (KR); Sung Wook Kim, Suwon-si (KR); Won Han, Suwon-si (KR); Dae Hun Jeong, Suwon-si (KR); Sang Heon Han, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 148 days.

(21) Appl. No.: 17/074,978

(22) Filed: Oct. 20, 2020

(65) Prior Publication Data

US 2021/0320644 A1    Oct. 14, 2021

(30) Foreign Application Priority Data

Apr. 13, 2020  (KR) .................. 10-2020-0044725

(51) Int. Cl.
*H03H 9/02* (2006.01)
*H03H 9/13* (2006.01)
*H03H 9/17* (2006.01)

(52) U.S. Cl.
CPC .... *H03H 9/02086* (2013.01); *H03H 9/02015* (2013.01); *H03H 9/132* (2013.01); *H03H 9/17* (2013.01)

(58) Field of Classification Search
CPC ...... H03H 9/17; H03H 9/02015; H03H 9/132; H03H 9/02118; H03H 9/173; H03H 9/15; H03H 9/02086; H03H 9/562

USPC ......................... 333/133, 187, 188
See application file for complete search history.

(56) References Cited

U.S. PATENT DOCUMENTS

| | | | |
|---|---|---|---|
| 9,571,063 | B2 | 2/2017 | Burak et al. |
| 10,284,173 | B2 | 5/2019 | Burak et al. |
| 2006/0071736 | A1 | 4/2006 | Ruby et al. |
| 2010/0013573 | A1 | 1/2010 | Umeda |
| 2014/0203686 | A1 | 7/2014 | Song et al. |
| 2017/0338399 | A1 | 11/2017 | Kim et al. |
| 2020/0373901 | A1* | 11/2020 | Liu ................ H03H 9/173 |

FOREIGN PATENT DOCUMENTS

| | | |
|---|---|---|
| JP | 5013227 B2 | 6/2012 |
| KR | 10-1280633 B1 | 7/2013 |
| KR | 10-2017-0130228 A | 11/2017 |
| KR | 10-1918031 B1 | 11/2018 |

\* cited by examiner

*Primary Examiner* — Rakesh B Patel
*Assistant Examiner* — Jorge L Salazar, Jr.
(74) *Attorney, Agent, or Firm* — NSIP Law

(57) ABSTRACT

A bulk-acoustic wave resonator includes: a first electrode; a piezoelectric layer at least partially disposed on an upper portion of the first electrode; and a second electrode disposed to cover at least a portion of the piezoelectric layer. The second electrode includes a frame disposed at an edge of an active region of the bulk-acoustic wave resonator, and the first electrode, the piezoelectric layer and the second electrode are disposed to overlap one another at the edge of the active region. The frame includes a wall disposed at the edge of the active region and a trench formed on an internal side of the wall. An internal boundary line of the trench has a concave-convex shape in a plane parallel to an upper surface of the frame.

19 Claims, 8 Drawing Sheets

BULK-ACOUSTIC WAVE RESONATOR

CROSS-REFERENCE TO RELATED APPLICATIONS

This application claims the benefit under 35 U.S.C. § 119(a) of Korean Patent Application No. 10-2020-0044725 filed on Apr. 13, 2020 in the Korean Intellectual Property Office, the entire disclosure of which is incorporated herein by reference for all purposes.

BACKGROUND

1. Field

The following description relates to a bulk-acoustic wave resonator.

2. Description of Related Art

Generally, a small bulk-acoustic wave resonator ("resonator") tends to have deteriorated performance, such as an increase in spurious noise, a notch size, or the like, in comparison to a larger resonator. The smaller the size of the resonator, the greater the specific gravity of a border of the resonator with respect to a resonating area of the resonator, thereby further enhancing an effect on the resonating area from the border.

A reason for such a tendency is that the border is directly related to performance of the resonator, since the border is a boundary at which acoustic energy generated by vibration of the resonator leaks from an inside of the resonator to the outside and is structurally discontinuous, which greatly affects a vibration form of the resonator itself.

Accordingly, there is a need to develop a structure for suppressing notch expression while suppressing spurious noises in a bulk-acoustic wave resonator.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a bulk-acoustic wave resonator includes: a first electrode; a piezoelectric layer at least partially disposed on an upper portion of the first electrode; and a second electrode disposed to cover at least a portion of the piezoelectric layer. The second electrode includes a frame disposed at an edge of an active region of the bulk-acoustic wave resonator, and the first electrode, the piezoelectric layer and the second electrode are disposed to overlap one another at the edge of the active region. The frame includes a wall disposed at the edge of the active region and a trench formed on an internal side of the wall. An internal boundary line of the trench has a concave-convex shape in a plane parallel to an upper surface of the frame.

The concave-convex shape may be a sawtooth shape.

An angle of inclination of the internal boundary line may be 15° to 80°.

The trench may include a plurality of trenches.

At least one trench among the plurality of trenches may have a size and a shape different from a size and a shape of other trenches among the plurality of trenches.

In the plane parallel to the upper surface of the frame, a portion of the internal boundary line may be in contact with the wall and another portion of the internal boundary line may be spaced apart from the wall.

The internal boundary line may be spaced apart from the wall in the plane parallel to the upper surface of the frame.

The concave-convex shape may be a shape of a wave crest.

The concave-convex shape may be a shape of a circular arc.

A peak of the circular arc may be in contact with the wall in the plane parallel to the upper surface of the frame.

A peak of the circular arc may be spaced apart from the wall in the plane parallel to the upper surface of the frame.

The concave-convex shape may be a shape of an irregular polygon.

In another general aspect, a bulk-acoustic wave resonator includes: a first electrode; a piezoelectric layer at least partially disposed on an upper portion of the first electrode; and a second electrode disposed to cover at least a portion of the piezoelectric layer. The second electrode includes a trench disposed at an edge of an active region of the bulk-acoustic wave resonator, and the first electrode, the piezoelectric layer, and the second electrode are disposed to overlap one another at the edge of the active region. An internal boundary line of the trench has a concave-convex shape in a plane parallel to an upper surface of the second electrode.

The second electrode may further include a wall disposed on an external side of the trench.

In the plane parallel to the upper surface of the second electrode, a portion of the internal boundary line may be in contact with the wall and another portion of the internal boundary line may be spaced apart from the wall.

The internal boundary line may be spaced apart from the wall in the plane parallel to the upper surface of the second electrode.

The concave-convex shape may be a sawtooth shape.

The concave-convex shape may be a shape of wave crest.

Other features and aspects will be apparent from the following detailed description, the drawings, and the claims.

BRIEF DESCRIPTION OF DRAWINGS

Throughout the drawings and the detailed description, the same reference numerals and characters refer to the same elements. The drawings may not be to scale, and the relative size, proportions, and depiction of elements in the drawings may be exaggerated for clarity, illustration, and convenience.

DETAILED DESCRIPTION

Figure 1:
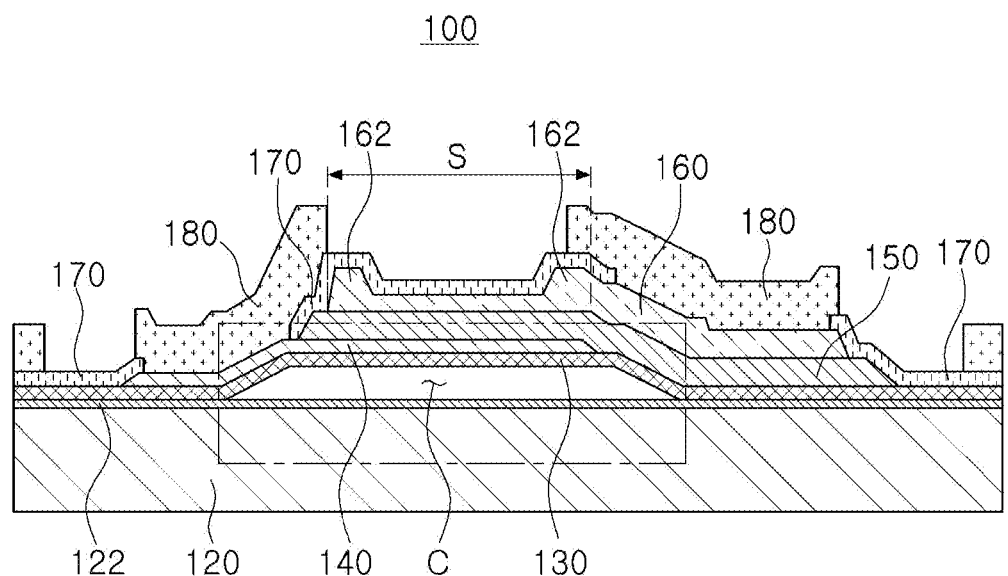
FIG. 1 is a cross-sectional diagram schematically illustrating a bulk-acoustic wave resonator, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
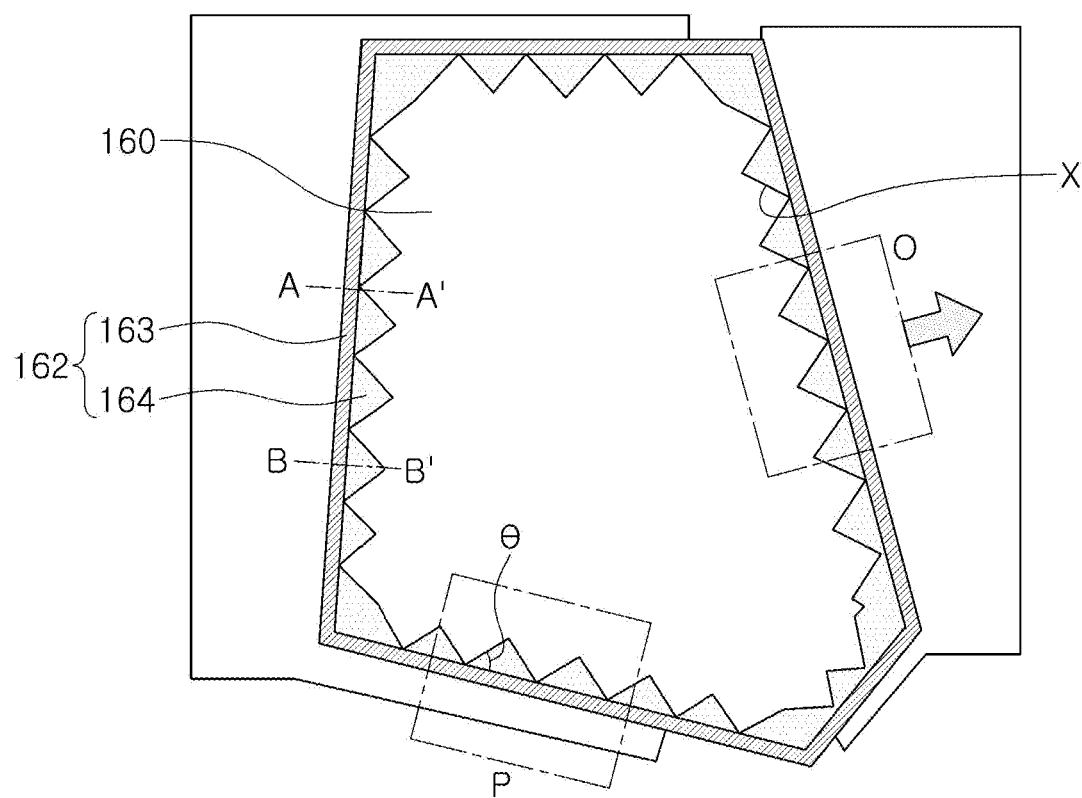
FIG. 2 is a plan view of a second electrode disposed in an active region of the bulk-acoustic wave resonator of FIG. 1, according to an embodiment.
Figure 3:
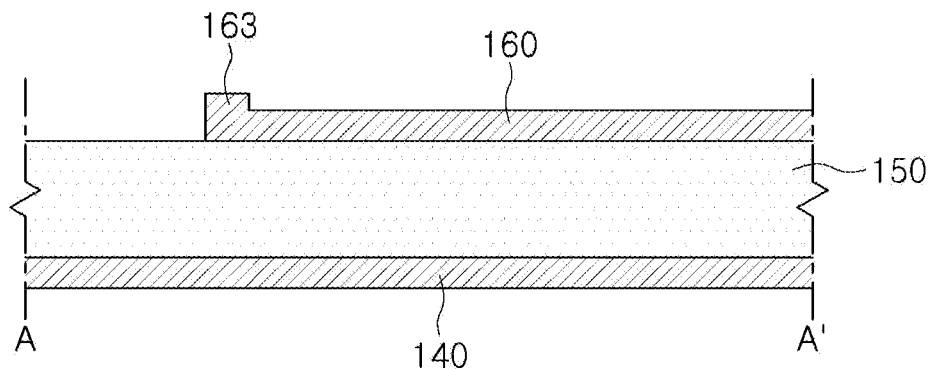
FIG. 3 is a cross-sectional diagram taken along line A-A' of FIG. 2.
Figure 4:
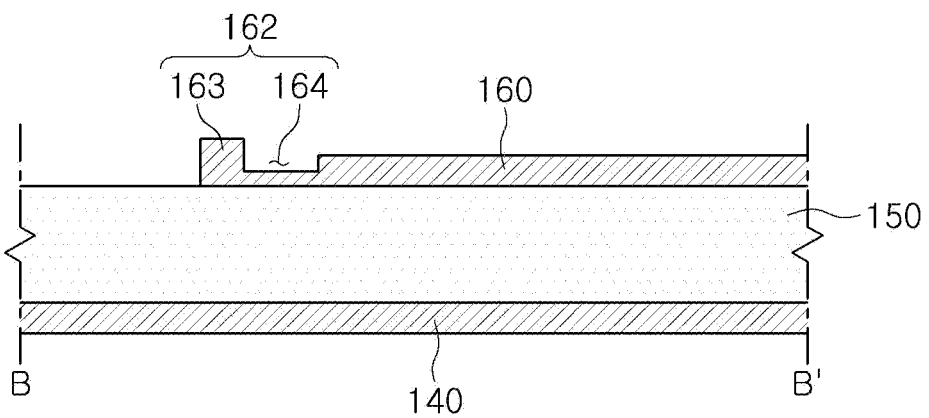
FIG. 4 is a cross-sectional diagram taken along line B-B' of FIG. 2.

FIG. 1 is a cross-sectional diagram schematically illustrating a bulk-acoustic wave resonator 100, according to an embodiment. FIG. 2 is a plan view of a second electrode 160 disposed in an active region S of the bulk-acoustic wave resonator 100, according to an embodiment. FIG. 3 is a cross-sectional diagram taken along line A-A' of FIG. 2, and FIG. 4 is a cross-sectional diagram taken along line B-B' of FIG. 2.

Referring to FIGS. 1 to 4, the bulk-acoustic wave resonator 100 may include, for example, a substrate 120, a membrane layer 130, a first electrode 140, a piezoelectric layer 150, a second electrode 160, a passivation layer 170, and a metal pad 180.

The substrate 120 may be a silicon substrate. For example, a silicon wafer or a silicon-on-insulator (SOI) type substrate may be used as the substrate 120.

An insulating layer 122 may be formed on an upper surface of the substrate 120 and may electrically isolate element(s) disposed on the upper surface of the substrate 120 from the substrate 120. When a cavity C is formed over the insulating layer 122 in a manufacturing process, the insulating layer 122 may prevent the substrate 120 from being etched by an etching gas.

In this example, the insulating layer 122 may be formed of any one of silicon oxide ($SiO_2$), silicon nitride ($Si_3N_4$), aluminum oxide ($Al_2O_3$), and aluminum nitride (AlN), and may be formed through any one of chemical vapor deposition, RF magnetron sputtering, and evaporation.

The membrane layer 130 may form a cavity C together with the substrate 120. Further, the membrane layer 130 may be formed of a material having low reactivity when a sacrificial layer (not illustrated) is removed using an etching gas. A dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as the membrane layer 130.

A seed layer formed of AlN may be formed on the membrane layer 130. That is, the seed layer may be disposed between the membrane layer 130 and the first electrode 140. The seed layer may be formed using a metal or a dielectric having a hexagonal close-packed (HCP) crystal structure, in addition to AlN. As an example, the seed layer may be formed of titanium (Ti).

The first electrode 140 is disposed on the membrane layer 130, and a portion of the first electrode 140 may be disposed on an upper portion of the cavity C. The first electrode 140 may be configured as either one of an input electrode and an output electrode for respectively inputting and outputting an electrical signal, such as a radio frequency (RF) signal, and the like.

For example, the first electrode 140 may be formed of a conductive material, such as molybdenum (Mo), or an alloy thereof, but is not limited thereto. The first electrode 140 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy of ruthenium (Ru), tungsten (W), iridium (Ir), platinum (Pt), copper (Cu), titanium (Ti), tantalum (Ta), nickel (Ni), or chromium (Cr).

The second electrode 160 may be formed to cover a portion of the piezoelectric layer 160 disposed on the upper portion of the cavity C. The second electrode 160 may be configured as either one of an input electrode and an output electrode for respectively inputting and outputting an electrical signal, such as a radio frequency (RF) signal, or the like. That is, when the first electrode 140 is configured as an input electrode, the second electrode 160 may be configured as an output electrode. When the first electrode 140 is configured as an output electrode, the second electrode 160 may be configured as an input electrode.

As an example, the second electrode 160 may be formed of a conductive material such as molybdenum (Mo) or an alloy thereof, but is not limited thereto. The second electrode 160 may be formed of a conductive material, such as ruthenium (Ru), tungsten (W), iridium (Ir), platinum (Pt), copper (Cu), titanium (Ti), tantalum (Ta), nickel (Ni), chromium (Cr), or the like, or an alloy of ruthenium (Ru), tungsten (W), iridium (Ir), platinum (Pt), copper (Cu), titanium (Ti), tantalum (Ta), nickel (Ni), or chromium (Cr).

A frame 162 disposed at an edge of the active region S may be formed in the second electrode 160. The active region S may be a region in which the first electrode 140, the piezoelectric layer 150 and the second electrode 160 are disposed to overlap one another.

The frame 162 includes a wall 163 disposed at the edge of the active region S and a trench 164 disposed on an internal side of the wall 163. The wall 163 is formed to be thicker than the remaining portion of the second electrode 160. As an example, when viewed from above, an internal boundary line X (see FIG. 2) of the trench 164 may have a concave-convex shape. As an example, the concave-convex shape of the internal boundary line of the trench 164 may be a sawtooth shape. The frame 162 may include, for example, a plurality of trenches 164 disposed around an inner perimeter of the wall 163.

Meanwhile, as illustrated FIG. 2, an angle of inclination θ of the internal boundary line of the trench 164 may be 15°.

As described above, the frame 162 includes the wall 163 and the trench 164, and the internal boundary line X of the trench 164 has a sawtooth shape. Accordingly, a spurious noise can be suppressed, and notch generation can be suppressed. In other words, the angle of inclination θ of the trench 164 may be increased by the wall 163, thereby suppressing the notch generation. If the frame 162 were to include the trench 164 only, but not the wall 163, the resonator performance may deteriorate at an anti-resonance frequency. Since the frame 162 includes the wall 163, however, deterioration of the resonator performance at an anti-resonance frequency may be prevented.

The passivation layer 170 is formed in a region excluding the first and second electrodes 140 and 160. The passivation layer 170 may prevent damage to the first and second electrodes 140 and 160 during a manufacturing process.

Further, a portion of the passivation layer 170 may be removed by etching to adjust a frequency performance during a final process. That is, a thickness of the passivation layer 170 may be adjusted. As an example, a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as the passivation layer 170.

The metal pad 180 may be connected to portions of the first and second electrodes 140 and 160 exposed from the passivation layer 170. As an example, the metal pad 180 may be formed of a material such as gold (Au), a gold-tin (Au—Sn) alloy, copper (Cu), a copper-tin (Cu—Sn) alloy, and aluminum (Al), or an aluminum alloy. For example, the aluminum alloy may be an aluminum-germanium (Al—Ge) alloy.

As described above, the frame 162 includes the wall 163 and the trench 164, and the internal boundary line X of the trench 164 may have a tooth shape. Accordingly, a spurious noise may be suppressed, and notch generation may also be suppressed.

An effect of the frame will be described in more detail below.

Figure 5:
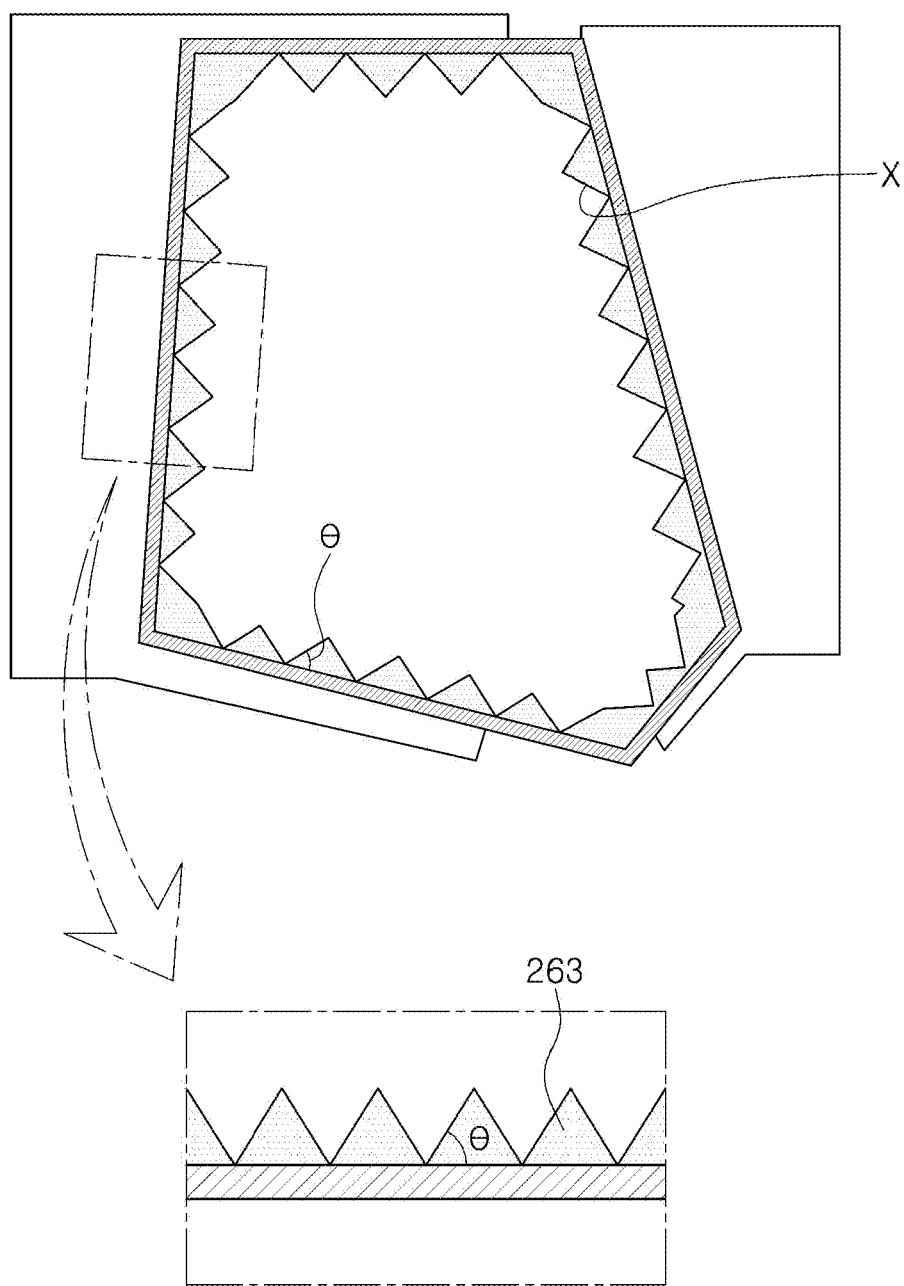
FIGS. 5 and 6 are plan views illustrating trench shapes of frames of bulk-acoustic wave resonators, according to embodiments.
Figure 6:
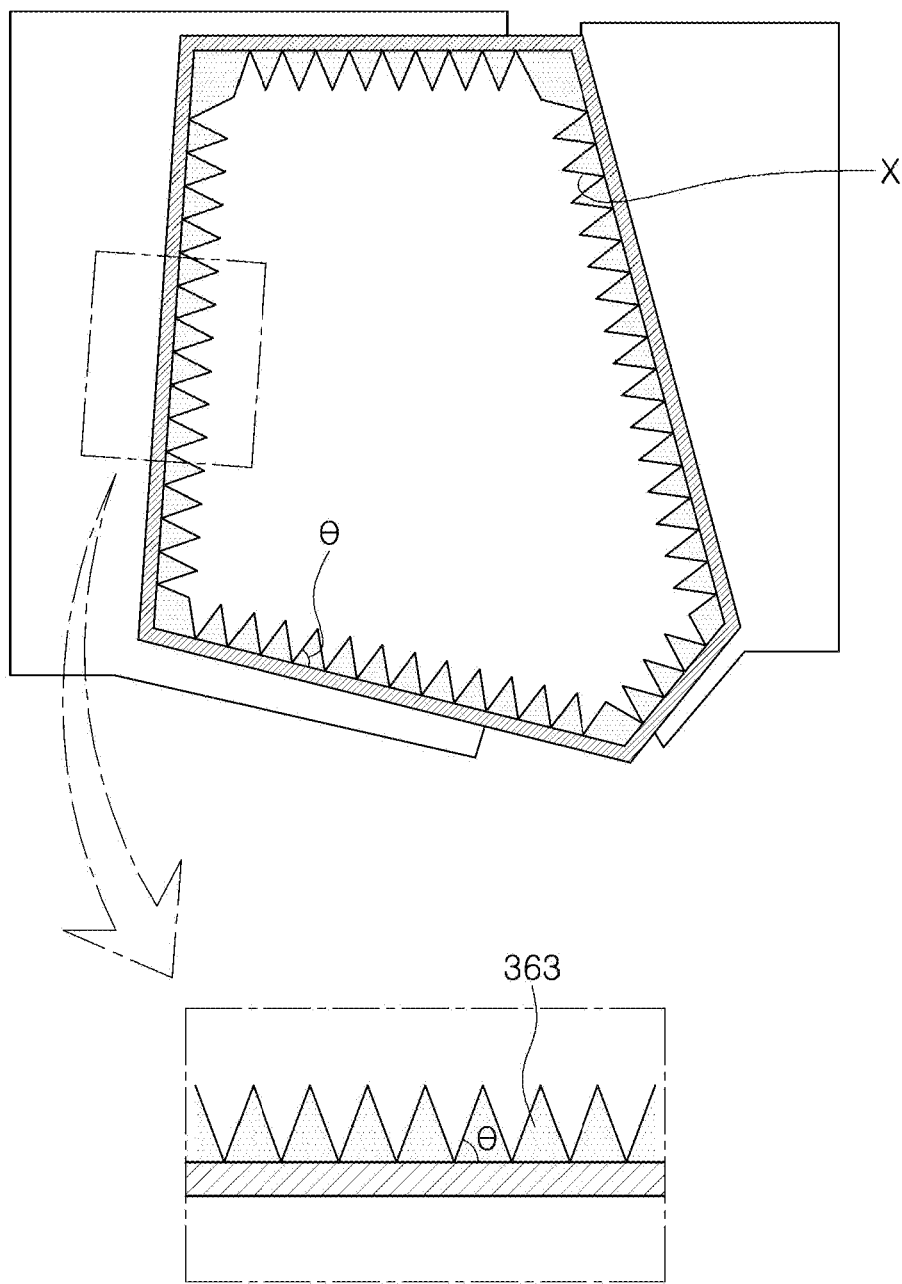
Figure 7:
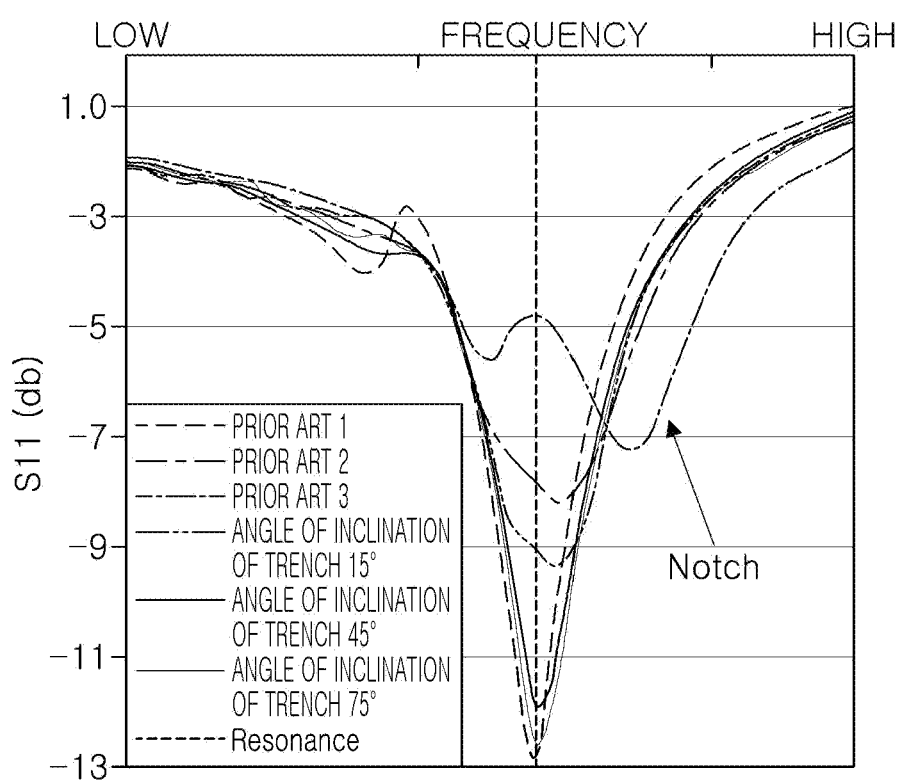
FIG. 7 is a graph illustrating a change in performance according to a trench shape of a frame, according to embodiments.

FIGS. 5 and 6 are plan views illustrating trench shapes of frames of bulk-acoustic wave resonators, according to embodiments. FIG. 7 is a graph illustrating a change in performance according to a trench shape of a frame, according to embodiments.

As illustrated in FIGS. 2, 5 and 6, angles of inclination θ of trenches 163, 263 and 363 may be set to 15°, 25°, 45°, 60°, 75° or 80°, for example. In this case, as the angle θ of inclination increases, a number of the trenches increases. That is, the angles θ of inclination of trenches 163, 263, and 363 may be 15° to 80°.

In such a case, as illustrated in FIG. 7, when compared to a conventional resonator, the embodiments disclosed herein may ameliorate a waveform distortion due to notch while suppressing the spurious noise to be at a level similar to that of the conventional resonator.

Further, when the angle of inclination θ increases, the waveform distortion due to the notch or a magnitude of the noise is similar; however, a loss may decrease at a resonance point, indicating the likelihood that performance may be further improved.

Figure 8:
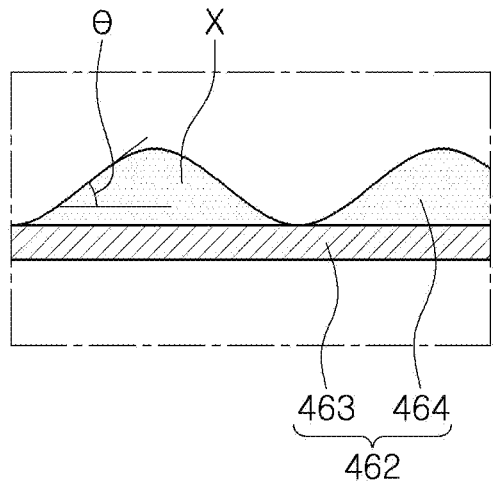
FIGS. 8 to 18 are diagrams illustrating trench shapes of frames, according to embodiments.

FIG. 8 is a diagram illustrating a trench shape of a frame 462, according to an embodiment.

Referring to FIG. 8, the frame 462 may include a wall 463 and a trench 464 disposed inside the wall 463. The frame 462 may include, for example, a plurality of trenches 464 connected to each other and disposed around an inner perimeter of the wall 463. An internal boundary line X of the trench 464 may have a shape of wave crest. When viewed from above (e.g., in a horizontal plane parallel to an upper surface of the frame 462), the internal boundary line X of the trench 464 may have a shape such that the internal boundary line X is repeatedly in contact with and spaced apart from the wall 463. That is, portions of the of the boundary line X are in contact with the wall 463, and other portions of the boundary line X are spaced apart from the wall 463.

Figure 9:
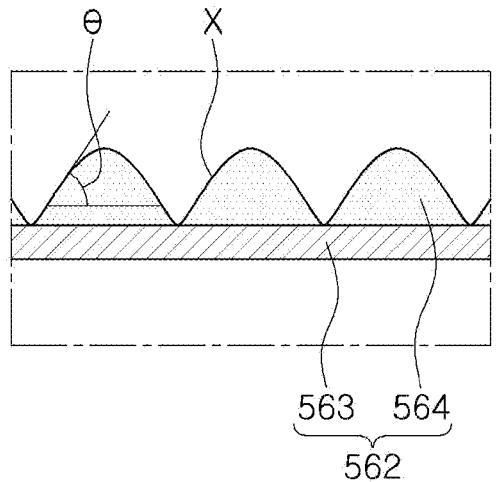

FIG. 9 is a diagram illustrating a trench shape of a frame 562, according to an embodiment.

Referring to FIG. 9, the frame 562 may be include a wall 563 and a trench 564 disposed inside the wall 563. The frame 562 may include, for example, a plurality of trenches 564 connected to each other and disposed around an inner perimeter of the wall 563. An internal boundary line X of the trench 564 may have a shape of wave crest. When viewed from above (e.g., in a horizontal plane parallel to an upper surface of the frame 562), the internal boundary line X of the trench 564 may have a shape such that the internal boundary line X is repeatedly in contact with and spaced apart from the wall 563. Further, a number of the trenches 564 may be greater than a number of the trenches 464 in FIG. 8.

Figure 10:
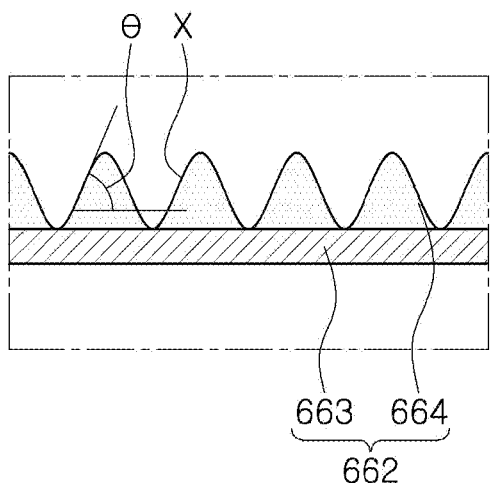

FIG. 10 is a diagram illustrating a trench shape of a frame 662, according to an embodiment.

Referring to FIG. 10, the frame 662 may include a wall 663 and a trench 664 disposed inside the wall 663. The frame 662 may include, for example, a plurality of trenches 664 connected to each other and disposed around an inner perimeter of the wall 663. An internal boundary line X of the trench 664 may have a shape of wave crest. When viewed from above (e.g., in a horizontal plane parallel to an upper surface of the frame 662), the internal boundary line X of the trench 664 may have a shape such that the internal boundary line X is repeatedly in contact with and spaced apart from the wall 663. Further, a number of the trenches 664 may be greater than a number of the trenches 564 in FIG. 9.

Figure 11:
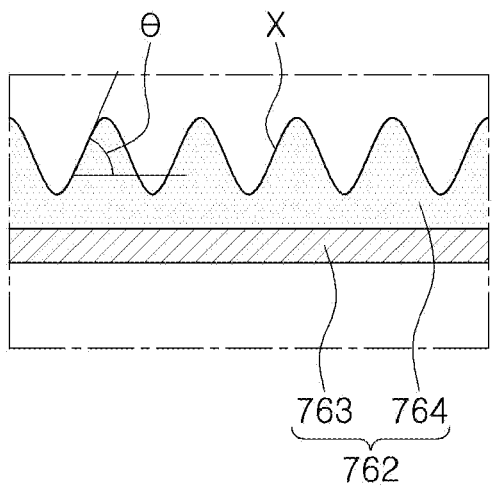

FIG. 11 is a diagram illustrating a trench shape of a frame 762, according to an embodiment.

Referring to FIG. 11, the frame 762 may include a wall 763 and a trench 764 disposed inside the wall 763. The frame 762 may include, for example, a plurality of trenches 764 connected to each other and disposed around an inner perimeter of the wall 763. An internal boundary line X of the trench 764 may have a shape of wave crest. When viewed from above (e.g., in a horizontal plane parallel to an upper surface of the frame 762), the internal boundary line X of the trench 764 may be spaced apart (e.g., entirely spaced apart) from the wall 763.

Figure 12:
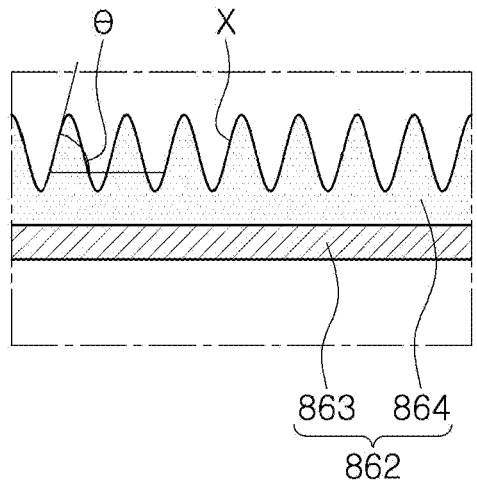

FIG. 12 is a diagram illustrating a trench shape of a frame 862, according to an embodiment.

Referring to FIG. 12, the frame 862 may include a wall 863 and a trench 864 disposed inside the wall 863. The frame 862 may include, for example, a plurality of trenches 864 connected to each other and disposed around an inner perimeter of the wall 863. An internal boundary line X of the trench 864 may have a shape of wave crest. When viewed from above (e.g., in a horizontal plane parallel to an upper surface of the frame 862), the internal boundary line X of the trench 864 may be spaced apart from the wall 863. The internal boundary line X of FIG. 12 may be farther spaced apart from the wall 863, as compared to the internal boundary line X of FIG. 11.

Figure 13:
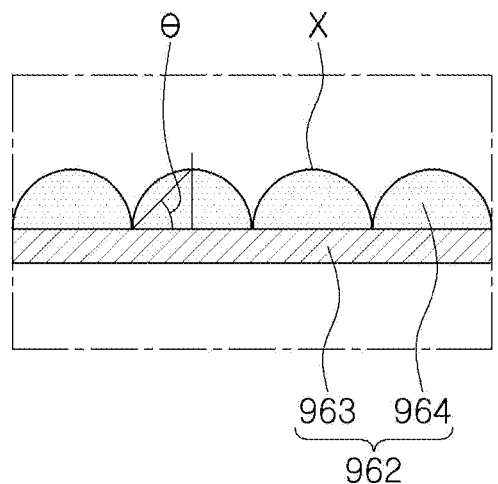

FIG. 13 is a diagram illustrating a trench shape of a frame 962, according to an embodiment.

Referring to FIG. 13, the frame 962 may include a wall 963 and a trench 964 disposed inside the wall 963. The frame 962 may include, for example, a plurality of trenches 964 connected to each other and disposed around an inner perimeter of the wall 963. An internal boundary line X of the trench 964 may have a shape of circular arc. The internal boundary line X of the trench 964 may be disposed such that a peak of the circular arc is spaced apart from the wall 963.

Figure 14:
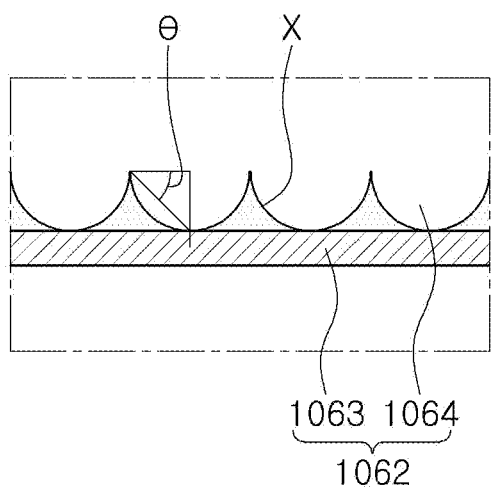

FIG. 14 is a diagram illustrating a trench shape of a frame 1062, according to an embodiment.

Referring to FIG. 14, the frame 1062 may include a wall 1063 and a trench 1064 disposed inside the wall 1063. An internal boundary line X of the trench 1064 may have a shape of circular arc. However, the internal boundary line X of the trench 1064 may have a shape that is inverted in comparison to that of the internal boundary line X of FIG. 13. That is, the internal boundary line X of the trench 1064 may be disposed such that a peak of the circular arc is in contact with the wall 1063. The frame 1062 may include, for example, a plurality of trenches 1064 connected to each other and disposed around an inner perimeter of the wall 1063.

Figure 15:
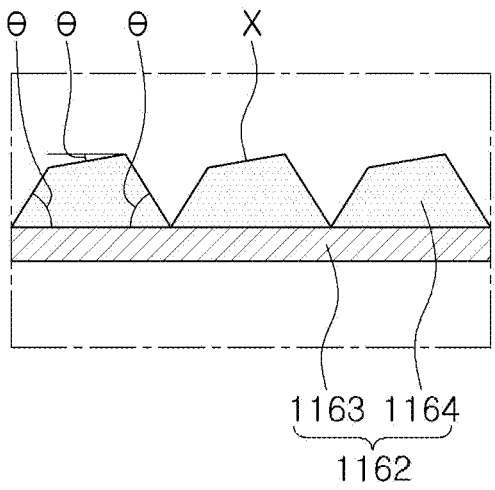

FIG. 15 is a diagram illustrating a trench shape of a frame 1162, according to an embodiment.

Referring to FIG. 15, the frame 1162 may include a wall 1163 and a trench 1164 disposed inside the wall 1163. An internal boundary line X of the trench 1164 may have a shape of irregular polygon, and a plurality of trenches 1164 may be repeatedly disposed to be connected to each other.

Figure 16:
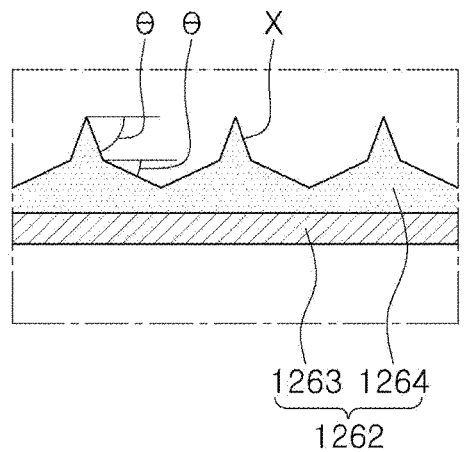

FIG. 16 is a diagram illustrating a trench shape of a frame 1262, according to an embodiment.

Referring to FIG. 16, the frame 1262 may include a wall 1263 and a trench 1264 disposed inside the wall 1263. An internal boundary line X of the trench 1264 may have a shape of irregular polygon, and a plurality of trenches 1264 may be repeatedly disposed to be connected to each other. The trench 1264 illustrated in FIG. 16, however, has a different shape from that of the trench 1164 illustrated in FIG. 15.

Figure 17:
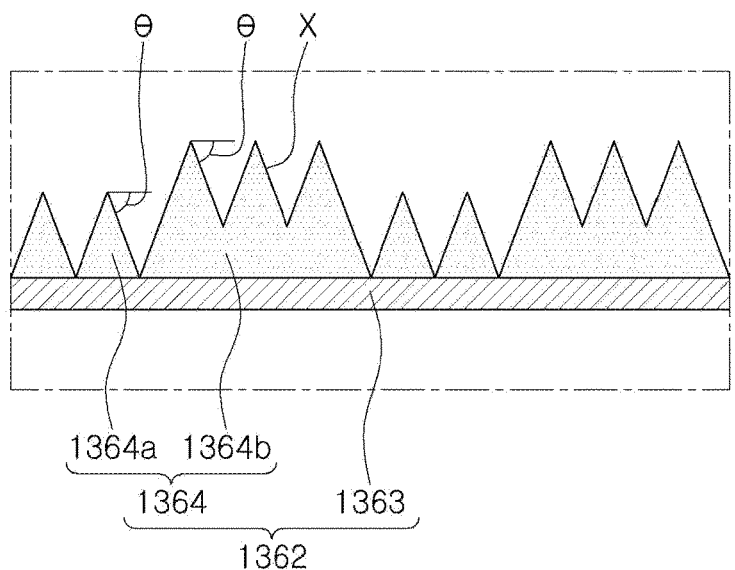

FIG. 17 is a diagram illustrating a trench shape of a frame 1362, according to an embodiment.

Referring to FIG. 17, the frame 1362 may include a wall 1363 and a trench 1364 disposed inside the wall 1363. The trench 1364 may include trenches having different shapes and sizes. For example, the trench 1364 may include a first trench 1364a and a second trench 1364b having different sizes and shapes. An internal boundary line X of the trench 1364 may have a sawtooth shape.

Two of the first trenches 1364a may be consecutively disposed, and second trenches 1364b may be disposed on both sides of the first trenches 1364a. In the illustrated embodiment, the trench 1364 includes the first and second trenches 1364a and 1364b. However, the disclosure is not limited to this embodiment. The trenches 1364 may be include various types of trenches.

Figure 18:
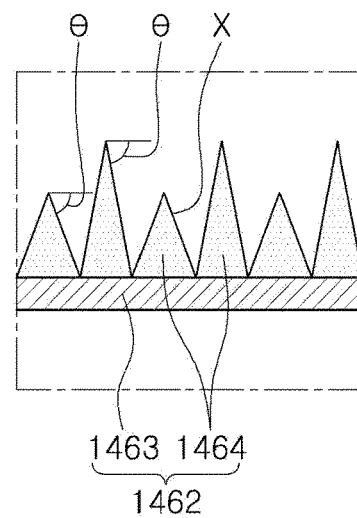

FIG. 18 is a diagram illustrating a trench shape of a frame 1462, according to an embodiment.

Referring to FIG. 18, the frame 1462 may include a wall 1463 and a trench 1464 disposed inside the wall 1463. A plurality of trenches 1464 may be provided may be formed to have different shapes and sizes. Meanwhile, an internal boundary line of the trench 1464 may have a tooth shape.

According to the embodiments described herein, an effect of suppressing notch expression while suppressing a spurious noise in a bulk-acoustic wave resonator may be obtained.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. In addition, respective embodiments may be combined with each other. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave resonator, comprising:
a first electrode;
a piezoelectric layer at least partially disposed on an upper portion of the first electrode; and
a second electrode disposed to cover at least a portion of the piezoelectric layer,
wherein the second electrode includes a frame disposed at an edge of an active region of the bulk-acoustic wave resonator, and the first electrode, the piezoelectric layer and the second electrode are disposed to overlap one another at the edge of the active region,
wherein the frame comprises a wall disposed at the edge of the active region and a trench formed on an internal side of the wall, and
wherein an internal boundary line of the trench has a concave-convex shape in a plane parallel to an upper surface of the frame, and an angle of inclination of the internal boundary line is 15° to 80°.

2. The bulk-acoustic wave resonator of claim 1, wherein the concave-convex shape is a sawtooth shape.

3. The bulk-acoustic wave resonator of claim 2, wherein the trench comprises a plurality of trenches.

4. The bulk-acoustic wave resonator of claim 3, wherein at least one trench among the plurality of the trenches has a size and a shape different from a size and a shape of other trenches among the plurality of trenches.

5. The bulk-acoustic wave resonator of claim 1, wherein the concave-convex shape is a shape of an irregular polygon.

6. The bulk-acoustic wave resonator of claim 1, wherein, in the plane parallel to the upper surface of the frame, a portion of the internal boundary line is in contact with the wall and another portion of the internal boundary line is spaced apart from the wall.

7. The bulk-acoustic wave resonator of claim 1, wherein the internal boundary line is spaced apart from the wall in the plane parallel to the upper surface of the frame.

8. The bulk-acoustic wave resonator of claim 1, wherein the concave-convex shape is a shape of a wave crest.

9. The bulk-acoustic wave resonator of claim 1, wherein the concave-convex shape is a shape of a circular arc.

10. The bulk-acoustic wave resonator of claim 9, wherein a peak of the circular arc is in contact with the wall in the plane parallel to the upper surface of the frame.

11. The bulk-acoustic wave resonator of claim 9, wherein a peak of the circular arc is spaced apart from the wall in the plane parallel to the upper surface of the frame.

12. A bulk-acoustic wave resonator, comprising:
a first electrode;
a piezoelectric layer at least partially disposed on an upper portion of the first electrode; and
a second electrode disposed to cover at least a portion of the piezoelectric layer,
wherein the second electrode includes a trench disposed at an edge of an active region of the bulk-acoustic wave resonator, and the first electrode, the piezoelectric layer, and the second electrode are disposed to overlap one another at the edge of the active region, and
wherein an internal boundary line of the trench has a concave-convex shape in a plane parallel to an upper surface of the second electrode, and an angle of inclination of the internal boundary line is 15° to 80°.

13. The bulk-acoustic wave resonator of claim 12, wherein the concave-convex shape is a shape of wave crest.

14. The bulk-acoustic wave resonator of claim 12, wherein the second electrode further comprises a wall disposed on an external side of the trench.

15. The bulk-acoustic wave resonator of claim 14, wherein, in the plane parallel to the upper surface of the second electrode, a portion of the internal boundary line is in contact with the wall and another portion of the internal boundary line is spaced apart from the wall.

16. The bulk-acoustic wave resonator of claim 14, wherein the internal boundary line is spaced apart from the wall, in the plane parallel to the upper surface of the second electrode.

17. The bulk-acoustic wave resonator of claim 12, wherein the concave-convex shape is a sawtooth shape.

18. A bulk-acoustic wave resonator, comprising:
a first electrode;
a piezoelectric layer at least partially disposed on an upper portion of the first electrode; and
a second electrode disposed to cover at least a portion of the piezoelectric layer,
wherein the second electrode includes a wall disposed at the edge of the active region and a trench formed on an internal side of the wall,
wherein an internal boundary line of the trench has a concave-convex shape, and
wherein the trench comprises a plurality of trenches.

19. The bulk-acoustic wave resonator of claim 18, wherein at least one trench among the plurality of the trenches has a size and a shape different from a size and a shape of other trenches among the plurality of trenches.

* * * * *